(12) United States Patent
Kadosh et al.

(10) Patent No.: US 8,193,831 B1
(45) Date of Patent: Jun. 5, 2012

(54) METHOD AND APPARATUS FOR REDUCING POWER CONSUMPTION IN A DIGITAL CIRCUIT BY CONTROLLING THE CLOCK

(75) Inventors: Aviran Kadosh, Misgav (IL); Golan Schzukin, Herzliya (IL)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/028,260

(22) Filed: Feb. 16, 2011

(51) Int. Cl.
*H03K 19/00* (2006.01)
*G06F 1/00* (2006.01)

(52) U.S. Cl. .............. 326/93; 326/46; 713/322

(58) Field of Classification Search .............. 326/26–28, 326/93–98, 46; 713/320, 322
See application file for complete search history.

(56) References Cited

U.S. PATENT DOCUMENTS

| | | | |
|---|---|---|---|
| 2004/0243866 A1* | 12/2004 | Sherburne, Jr. | 713/320 |
| 2007/0014388 A1* | 1/2007 | Buchholtz | 375/354 |
| 2007/0052448 A1* | 3/2007 | Peeters et al. | 326/93 |
| 2011/0231565 A1* | 9/2011 | Gelter et al. | 709/231 |

* cited by examiner

*Primary Examiner* — Don Le
(74) *Attorney, Agent, or Firm* — Weiss & Arons LLP

(57) ABSTRACT

A method and apparatus that controls the clock of a digital circuit, and therefore power consumption, without substantially comprising performance is provided. The apparatus may include monitoring the utilization of a First in First Out (FIFO) buffer. For example in a systems and methods according to the invention, clock speed may be reduced when the FIFO is relatively empty and increased when the FIFO is relatively full. The clock speed may be controlled by a phase locked loop, a clock divider, a clock masking device or a combination of more than one of these methods. Power reduction may also be obtained by controlling the clocking of different stages of a pipelined device. One or more aspects of the inventions may be implemented in combination with other aspects of the invention to further reduce power use.

36 Claims, 12 Drawing Sheets

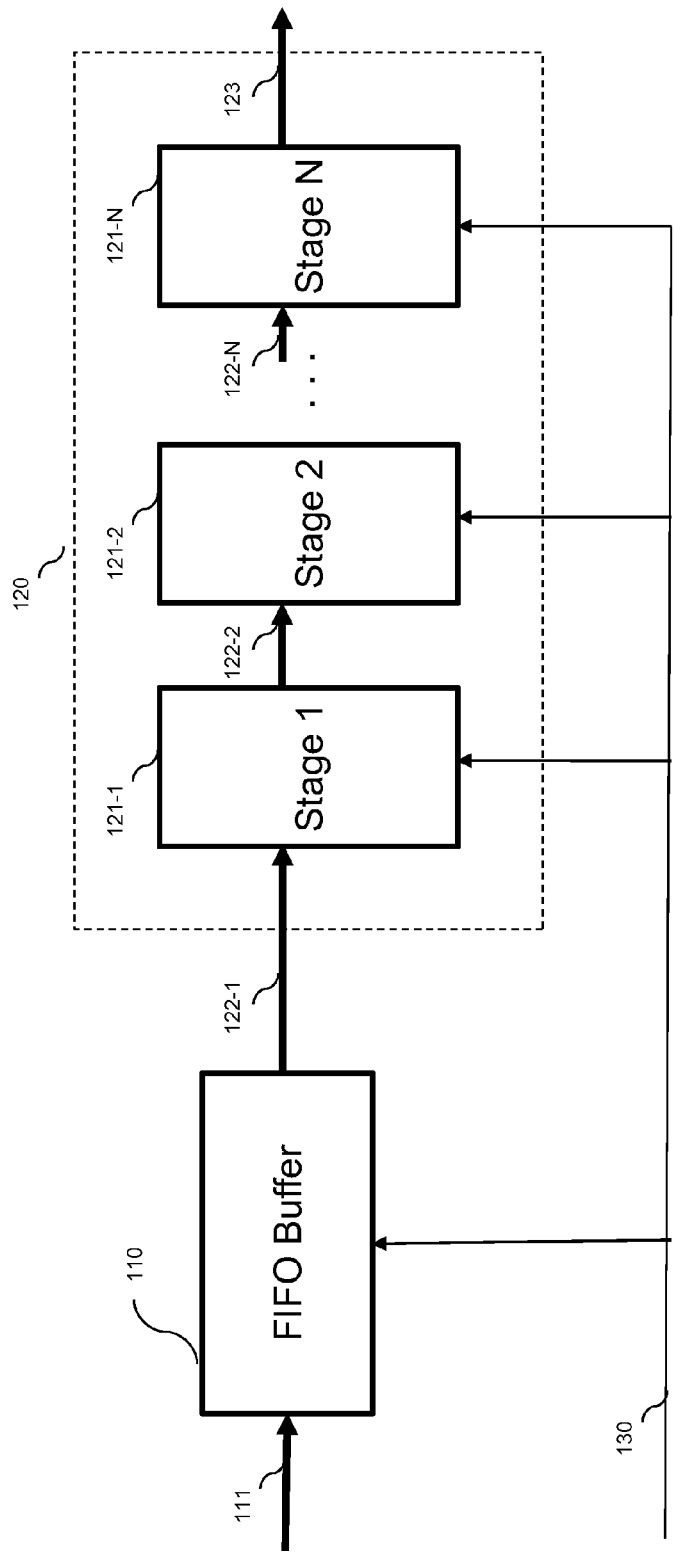

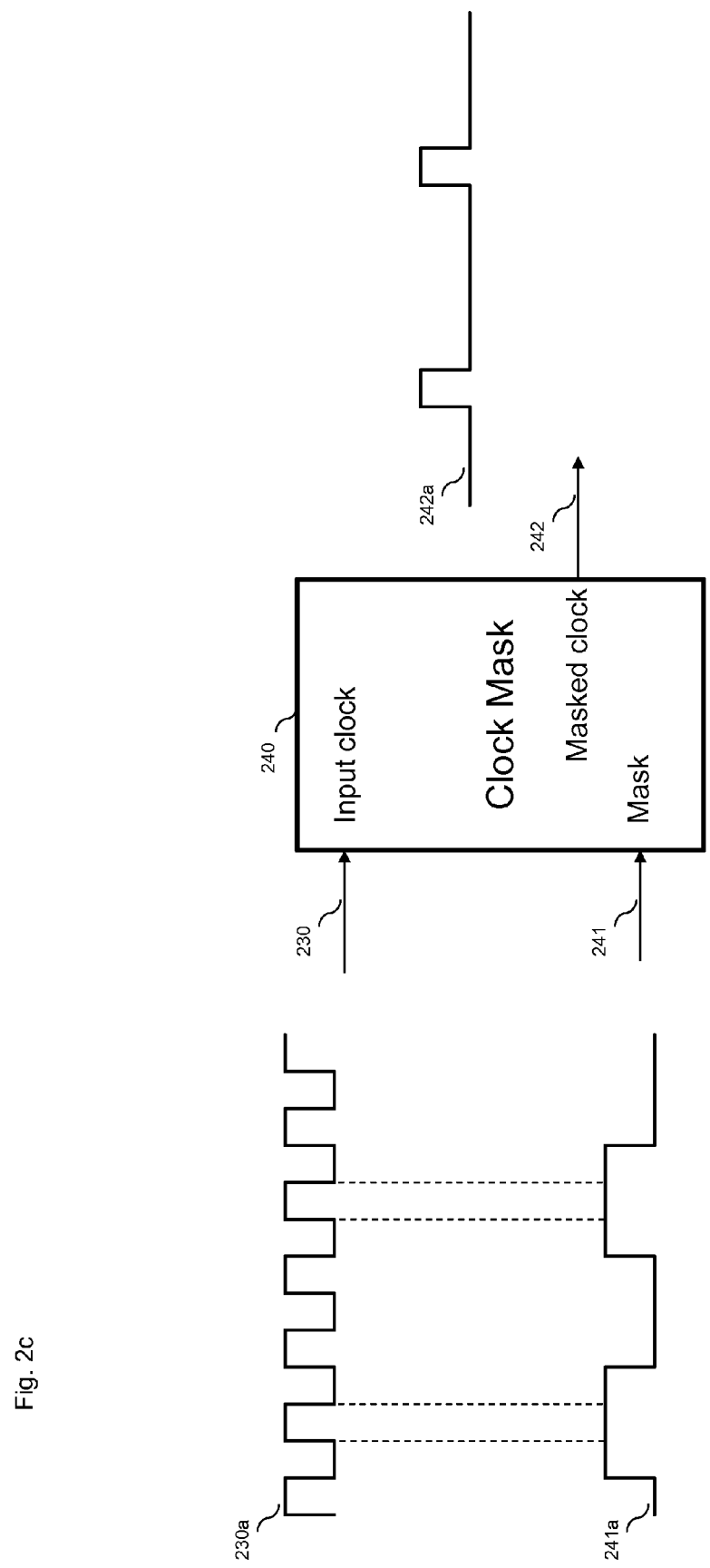

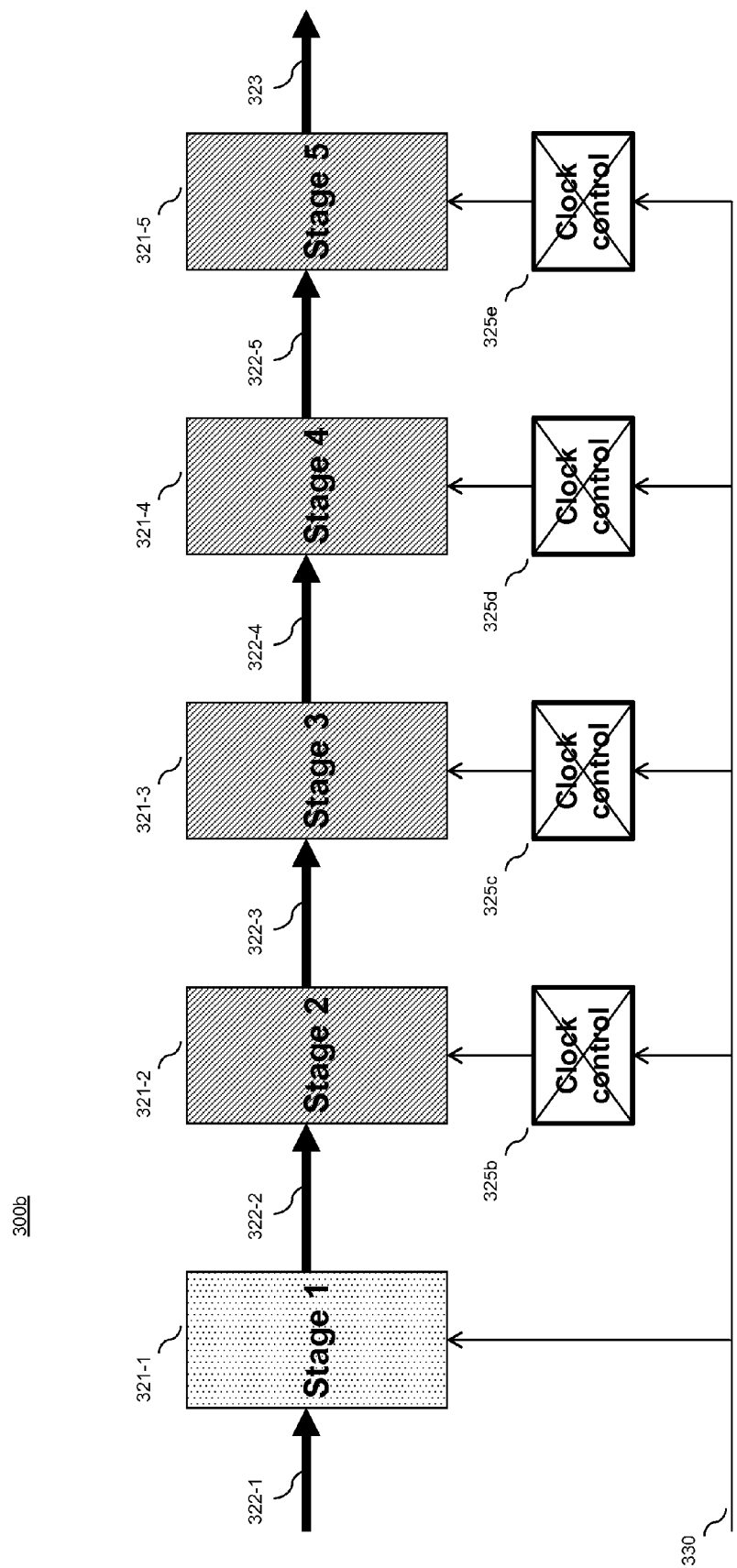

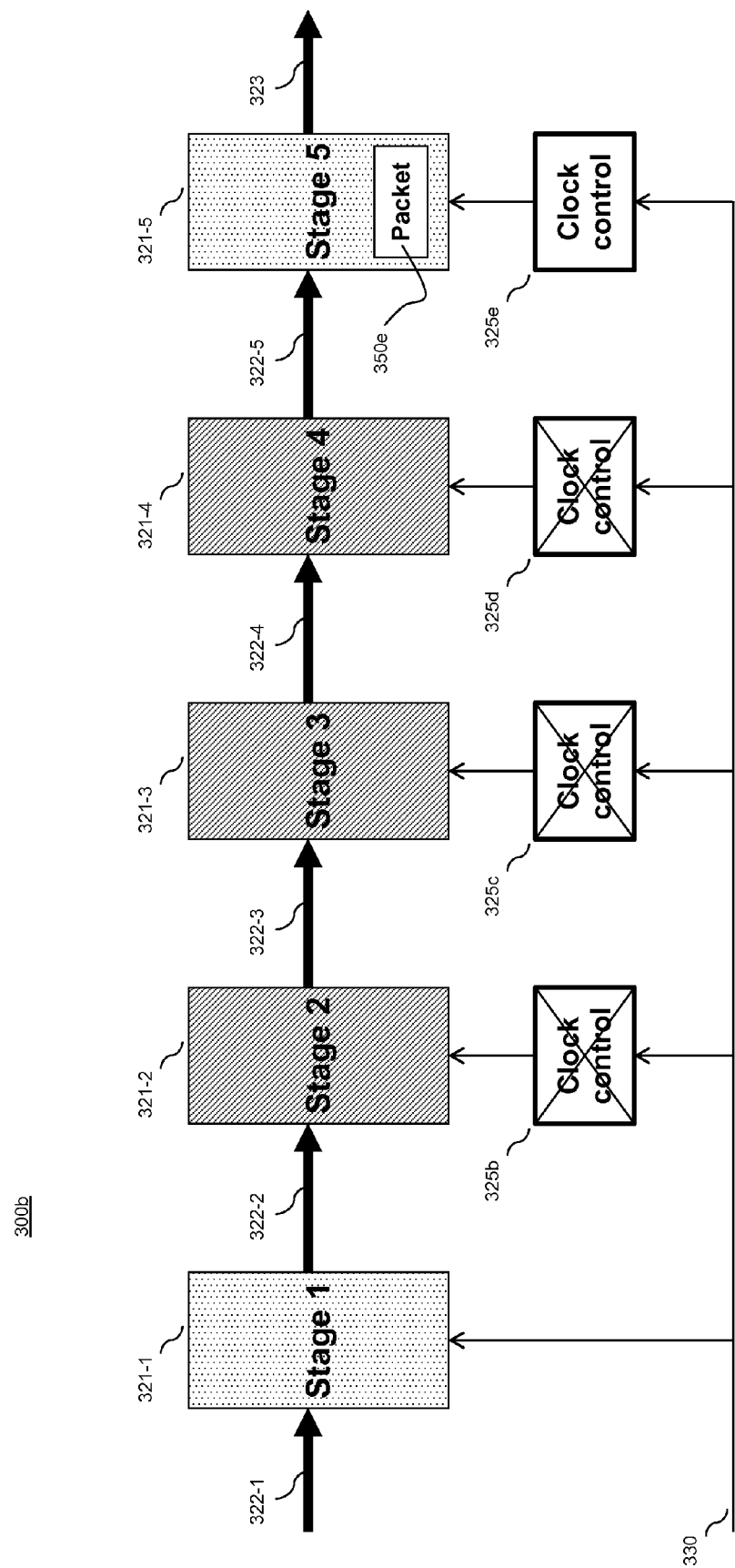

METHOD AND APPARATUS FOR REDUCING POWER CONSUMPTION IN A DIGITAL CIRCUIT BY CONTROLLING THE CLOCK

FIELD OF TECHNOLOGY

Aspects of the disclosure relate to providing methods and apparatus for reducing power in a clocked digital circuit.

BACKGROUND OF THE INVENTION

Typical semiconductor devices are operated by a clock. Additional power may be consumed by the device whenever the circuit is "clocked"—i.e., on every clock cycle. When the clock frequency is higher, more power may be consumed by the device. Higher power consumption requires larger power supplies. Furthermore, higher power consumption causes waste heat to build up in the relatively small area of the device. Heat levels may eventually rise to the point where specialized cooling of the device is required. Additionally, typical semiconductor devices fail more often when operating at higher temperatures. However, advanced devices often require high clock speeds to meet system requirements.

It would be desirable, therefore, to provide an apparatus and/or methods that control the clock frequency, and therefore power consumption, without comprising performance.

SUMMARY OF THE INVENTION

A semiconductor device or system, substantially as shown in and/or described in connection with at least one of the figures, as set forth more completely in the claims. The device may include mechanisms that control the clock frequency.

BRIEF DESCRIPTION OF THE DRAWINGS

The objects and advantages of the invention will be apparent upon consideration of the following detailed description, taken in conjunction with the accompanying drawings, in which like reference characters refer to like parts throughout, and in which:

FIG. 1a shows a typical device comprised of a buffer and pipeline stages;

FIG. 2c shows masked clock module;

Figure 1B:
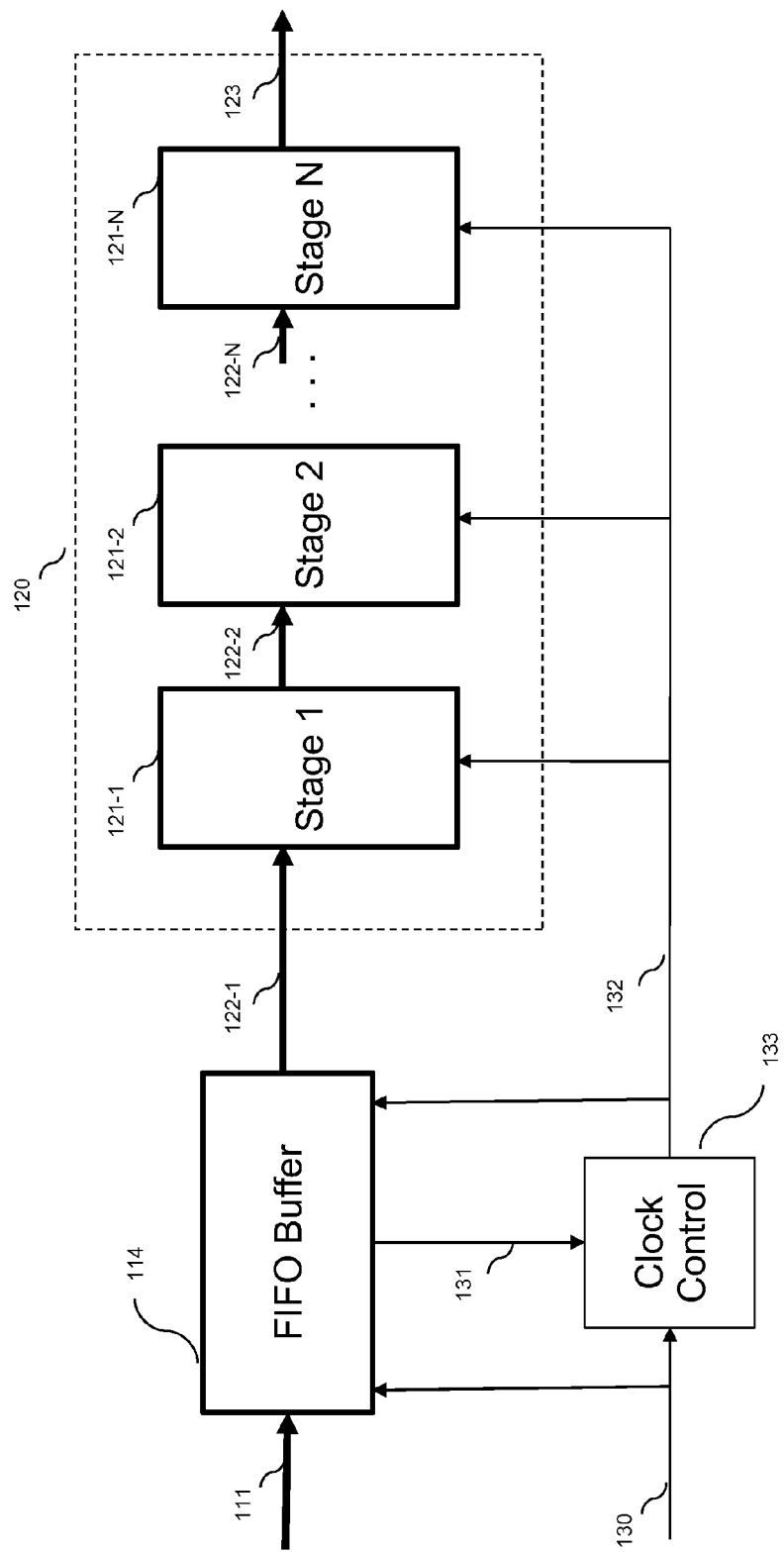
FIG. 1b shows a typical device comprised a buffer, a clock control circuit and pipeline stages.

3a shows a data path comprised of a series of pipeline stages;

3b shows a data path comprised of a series of pipeline stages and clock control where stage 1 is active;

3c shows a data path comprised of a series of pipeline stages and clock control where stages 1-2 are active;

3d shows a third data path comprised of a series of pipeline stages and clock control where stages 1-3 are active;

3e shows a fourth data path comprised of a series of pipeline stages and clock control where stage 1 and stages 3-4 are active;

3f shows a fifth data path comprised of a series of pipeline stages and clock control where stage 1 and stages 4-5 are active;

3g shows a sixth data path comprised of a series of pipeline stages and clock control where stage 1 and stage 5 are active;

3h shows a seventh data path comprised of a series of pipeline stages and clock control where stage 1 and stages 3-5 are active.

DETAILED DESCRIPTION OF THE DISCLOSURE

Apparatus and methods for reducing the power consumption of a digital circuit are provided.

Illustrative embodiments of apparatus and methods in accordance with the principles of the invention will now be described with reference to the accompanying drawings, which form a part hereof. It is to be understood that other embodiments may be utilized and structural, functional and procedural modifications may be made without departing from the scope and spirit of the present invention.

As will be appreciated by one of skill in the art, the invention described herein may be embodied in whole or in part as a method, a data processing system, or a computer program product. Accordingly, the invention may take the form of an entirely hardware embodiment, an entirely software/firmware embodiment or an embodiment combining software, firmware, hardware and any other suitable approach or apparatus.

Furthermore, such aspects may take the form of a computer program product stored by one or more computer-readable storage media having computer-readable program code, or instructions, embodied in or on the storage media. Any suitable computer readable storage media may be utilized, including hard disks, EEPROM, Flash memory, SRAM, DRAM, CD-ROMs, optical storage devices, magnetic storage devices, and/or any combination thereof. In addition, various signals representing data or events as described herein may be transferred between a source and a destination in the form of electromagnetic waves traveling through signal-conducting media such as metal wires, optical fibers, and/or wireless transmission media—e.g., air and/or space.

A digital circuit may be fully utilized at all times. In such an application the clock frequency will be set permanently according to the processing requirements of the circuit. However, many circuits process data in a "bursty" manner—i.e., in some time periods, more data is processed and in other time periods less data is processed. Systems and methods according to the invention propose changing the clock frequency according to the workload of the circuit.

In a software configuration according to the invention, a computer readable medium may preferably include instructions to control a trigger signal (that is used as a clock) that triggers predetermined code execution for the clocked device. In such an embodiment, redundant CPU cycles may be saved, depending on the amount of data in the buffer, as necessary, according to the processing requirements of the device. Such elimination of redundant CPU cycles may preferably lead to power savings.

One possible configuration of a digital circuit 100a is shown in FIG. 1. Digital circuit 100a may be a packet processing circuit. Data to be processed by the circuit enters via input 111 to a first-in-first-out (FIFO) buffer 110. Other suitable buffers may be used in place of or in addition to the FIFO 110—e.g., a last in first out buffer.

The FIFO 110 is connected to a clocked circuit 120. The FIFO 110 may absorb bursts of data. The clocked circuit 120 may be comprised of pipeline stages 1, 2 ... N. FIG. 1a shows pipeline stage 1 as 121-1, stage 2 as 121-2 and stage N as 121-N. While clocked circuit 120 is shown as a pipelined circuit, it should be noted that systems and methods according to the invention are preferably applicable to any suitable circuit—with or without pipelined stages. In embodiments of the invention without pipelined stages, FIFO 110 may preferably act in ways similar as those described herein with respect to a pipelined circuit.

The FIFO 110 connects to stage 121-1 via connection 122-1. The output of stage 121-1 connects to the input of stage 121-2 via connection 122-2. The last stage of the clocked circuit 120, stage 121-N is connected the previous stage via connection 122-N. The output 123 of pipeline stage 121-N is the output of clocked circuit 120.

The FIFO 110 and every stage 121-1-121-N of clocked circuit 120 are clocked by a single clock 130. The FIFO 110 will receive data in every clock cycle until it becomes full. The clocked circuit 120 will remove data from FIFO 110 in every clock cycle that it is able to process data. If the same amount of data is removed and processed by the clocked circuit 120 as received by the FIFO 110, then no data accumulates in the FIFO buffer 110. When the clocked circuit 120 is unable to process data at the same rate that the FIFO 110 receives data, some data will accumulate in FIFO 110. At times, data will be processed by clocked circuit 120 when no data is sent to FIFO 110 via input 111. In that case accumulated data will be removed from FIFO 110 and processed.

The FIFO 110 may become empty which may cause clocked circuit 120 to become idle. At times, the FIFO may become full and data arriving via input 111 may be lost. Irrespective of the presence or absence of data, digital circuit 100a is clocked on very clock cycle and uses the maximum power to operate.

The FIFO 110 may feed data via connection 122-1 to clocked circuit 120 on every clock cycle without regard to the structure of the data. In an alternative embodiment of digital circuit 100a, data may be processed preferably when a complete item—e.g., a data packet—is in FIFO 110. Other suitable restrictions on the operation of the FIFO 110 and clocked circuit 120 are contemplated and are included within the scope of the invention.

FIG. 1b shows an embodiment of the invention, digital circuit 100b. Data to be processed by the circuit enters via input 111 to a first-in-first-out (FIFO) buffer 114. Other suitable buffers may be used in place of or in addition to the FIFO 110—e.g., a last in first out buffer.

The FIFO 114 is connected to a clocked circuit 120. The clocked circuit 120 may be comprised of pipeline stages 1, 2 . . . N. The FIFO 114 connects to stage 121-1 via connection 122-1. The output of stage 121-1 connects to the input of stage 121-2 via connection 122-2. The last stage of the clocked circuit 120, stage 121-N is connected to the previous stage via connection 122-N. The output 123 of pipeline stage 121-N is the output of clocked circuit 120.

FIFO 114 may be configured with an input clock 130 for receiving data via data input 111. An output clock 132 may be used for removing data from FIFO 114 via connection 122-1. A clock control 133 converts the input clock 130 into output clock 132 based on status signal 131. Alternative configurations may allow clock control 133 to generate a distinct FIFO input clock as well.

In certain embodiments of the invention, information represented in signal 131 may be compared to an equilibrium threshold value. When the amount of information stored in FIFO 114, as represented by signal 131, is below the equilibrium threshold value, then clock control 133 may be instructed to reduce clock frequency. As long as the amount of information stored in FIFO 114, as represented by signal 131, is at or above the equilibrium threshold value, clock control 133 may maintain, or increase, the clock frequency. The determination to maintain or to increase the clock frequency may be based on the relationship of the magnitude of information stored in FIFO 114 with respect to the equilibrium threshold value. For example, if the amount of information stored in FIFO 114 is much greater than the equilibrium threshold value, then clock control 133 may increase the clock frequency. If the amount of information stored in FIFO 114 equal to, or just slightly greater than the equilibrium threshold value, then clock control 133 may maintain the clock frequency at its current level.

In other embodiments of the invention, signal 131 may indicate the available space remaining in the buffer of FIFO 114. If FIFO 114 is nearly full than clock control 133 may be directed to generate clock 132 at the maximum possible rate. If FIFO 114 is half full, then clock control 133 may be directed to generate clock 132 at a moderate rate. If FIFO 114 is almost empty, then clock control 133 may be directed to generate clock 132 at a minimal rate.

More than one buffer may be used in place of the single FIFO 114 shown in FIG. 1b. Alternate configuration may use multiple buffers feeding one or more inputs to clocked circuit 120. Control from the multiple buffers maybe collected into clock control 133.

Clock control 133 may generate two discrete clock speeds, generate more than two discrete clock speeds or generate a continuum of clock speeds. Status signal 131 may be a single signal or several signals depending on the nature of clock control 133 and the nature of FIFO 110.

Typically input clock 130 operates as a maximum rate clock and clock control 133 may be used to generate an output clock 132 that is a fraction of the input clock 130. It is possible for the clock control to generate an output clock 132 that is at higher frequency than input clock 130. The output clock 132 may be synchronized to the input clock 130 or it may have no relationship to the input clock 130. The output clock 132 may be an integer fraction of input clock 130. Each of these relationships in any suitable combination are contemplated and are included within the scope of the invention.

Figure 2A:
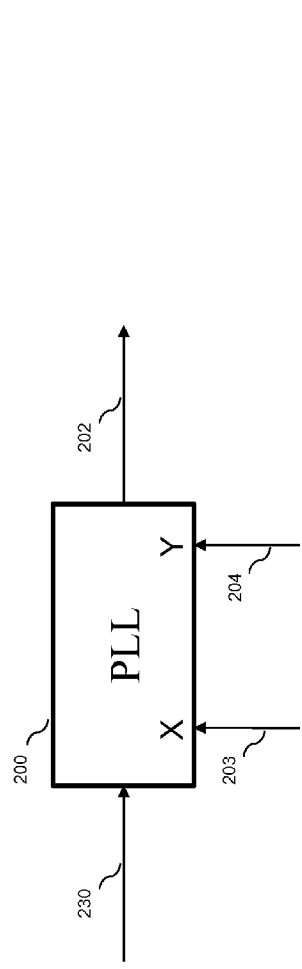
FIG. 2a shows a phase locked loop.

FIG. 2a shows an embodiment of clock control 133 as a Phase Locked Loop (PLL) 200. A PLL may receive an input clock 230 which is preferably clock 130 in FIG. 1b and may generate an output clock 202 which may be used as clock 132 in FIG. 1b. The frequency of output clock 202 may be set according to parameters X via input 203 and/or Y via input 204. Preferably the inputs 203 and 204 are part or all of status signal 131 of FIG. 1b. In one embodiment of PLL 200 parameters 203 and 204 may be a tune voltage and an offset voltage or a digital signal which generates those voltages. Other options include using only a single parameter, operating an internal divider or any other suitable method of operating a PLL. The PLL 200 may generate a variety of output clock frequencies both higher and lower than the input clock 230. Preferably the output clock frequency 230 will be lower than the input clock frequency 202.

Figure 2B:
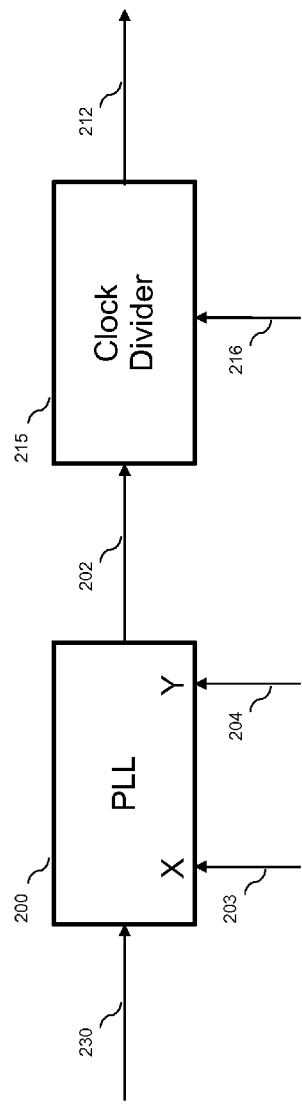
FIG. 2b shows a phase locked loop and a clock divider.

FIG. 2b shows another version of clock control 133; this time implemented as a PLL 200 connected to clock divider 115. The PLL is operated as described with reference to FIG. 2a. The output 202 of PLL 200, which is preferably clock 130 shown in FIG. 1b, may be divided to a lower frequency via clock divider 115 to generate output clock 212 which may be used as clock 132 in FIG. 1b. When this embodiment is used clock control 131 may also set the clock divider ratio via input 216. This may provide more flexibility than the use of PLL 200 alone.

FIG. 2c shows another implementation of clock control 133; this time as a clock masking control 240. Clock masking control 140 has an input clock 230 which is preferably clock 130 in FIG. 1b. An example waveform of clock 230 is illustrated as 230a. Clock masking device 240 utilizes a masking signal 241 to generate masked clock 242. An example waveform of clock 241 is illustrated as 241a. If the example waveform 230a is combined with example waveform 241a via a logical "and" operation the resulting masked waveform 242a will be produced. The frequency of masked clock 242 is controlled by the combining logic of the clock mask control 240 and the phase, frequency and duty cycle of masking signal 241. Preferably the status signal 131 of FIG. 1 may be used to generate the masking signal.

The PLL 200 of FIG. 2a may be combined with the clock masking control 240. Likewise the PLL 200 combined with clock divider 115 may also be combined with clock masking control 240. Suitable status signals 131 are necessary to control each combination.

Although the configuration of FIG. 1b shows a buffer feeding a clocked circuit other configurations,—e.g., a clocked circuit feeding a buffer—are possible. If a clocked circuit were to feed a buffer the clock could be controlled depending on the fullness of the buffer. Preferably in such a configuration the clock would be set to maximum speed when the buffer is empty and slowed to a minimum when the buffer is almost full. The clock may be halted when the buffer is completely full. Other suitable configurations involving more than one buffer for one or more inputs and/or one or more buffers for one or more outputs of the clocked circuit are contemplated. If more than one buffer is connected to the clocked circuit than of the control of the clock may involve some or all of the buffers.

Figure 3A:
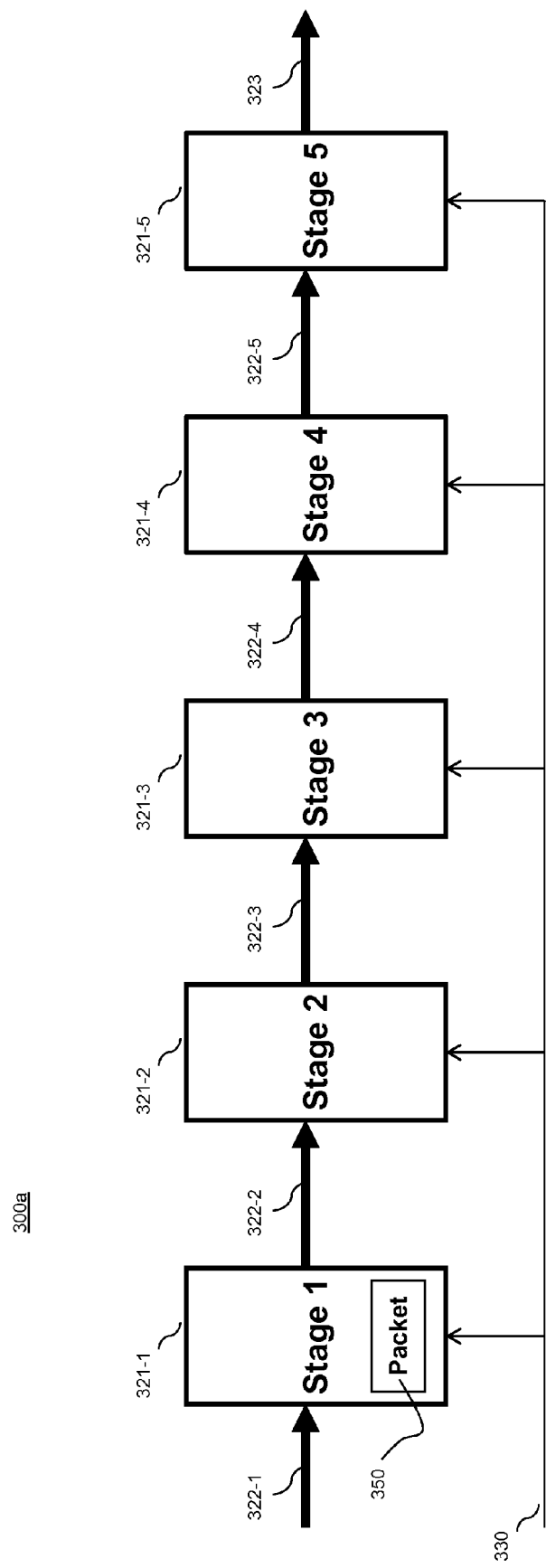

FIG. 3a shows a pipeline 300a comprised of stages 1-5 labeled 321-1-321-5 respectively. The input to pipeline 300a is via data input 322-1 which connects to the input of stage 321-1. The output of stage 321-1 connects to the input of stage 322-2 via connection 322-2. The output of stage 321-2 connects to the input of stage 321-2 via connection 322-3. The output of stage 321-3 connects to the input of stage 321-4 via connection 322-4. The output of stage 321-4 connects to the input of stage 321-5 via connection 322-5. The output of stage 321-5 is 323 with is also the output of pipeline 300a.

Pipeline 300a may be a packet processing circuit. The pipeline 300a is shown with a single packet 350 being processed in stage 321-1. All other stages are not processing data. All of the stages 321-1-321-5 are typically administered by a single clock 330. In the situation shown all of the stages 321-1-321-5 are operating and consuming power preferably when stage 321-1 is accomplishing useful work.

FIG. 3b shows a pipeline 300b comprised of stages 1-5 labeled 321-1-321-5 respectively. The input to pipeline 300a is via data input 322-1 which connects to the input of stage 321-1. The pipeline stages are 321-2, 321-3, 321-4 and 321-5 connected via connections 322-2, 322-3, 322-4 and 322-5 respectively. The output of stage 321-5 is 323 with is also the output of pipeline 300b.

Stage 321-1 may be clocked by clock 330. It is assumed that stage 321-1 is always operational to process data when the data arrives. In contrast, clock 330 may clock stage 321-2 preferably when permitted by clock control 325b. Clock control 325b may permit stage 321-2 to operate when a packet arrives for processing in stage 321-1, that is when a packet is being processed by an immediately previous stage. Thus, clock control 325b may permit stage 321-2 to operate when a packet is present in stage 321-2. Clock control 325b may idle stage 321-2 when there is no packet present in either of stages 321-1 and 321-2.

Similarly clock control 325c-325e permits or prevents the clocking of stages 321-3-321-5 respectively. Clock control 325b-325e permit the clocking of stages 321-2-321-5 preferably when data is present in the previous stage or in the stage itself. This strategy may reduce power use by pipeline 300b. Other suitable strategies to reduce power or to trade performance for power reduction are contemplated and included within the scope of the invention.

Although FIG. 3b shows the clock control as providing the clock, any suitable method of permitting a stage to operate or idling a stage are contemplated and included within the scope of the invention. One such alternative requires each stage to have a clock enable and a clock input. The clock control may operate the clock enable instead of permitting the stage to operate by supplying a clock signal.

FIG. 3b shows the status of pipeline 300b when no data is present in any of the pipeline stages. Therefore, stage 321-1 is operational waiting for the appearance of data,—e.g., a data packet. Stages 321-2-321-5 may be idle.

In an alternative embodiment stage 321-1 may also be idle—e.g., in a sleep mode—in the absence of data to process. Stage 321-1 may be triggered to an operational state preferably upon the arrival or the impending arrival of new data.

Figure 3C:
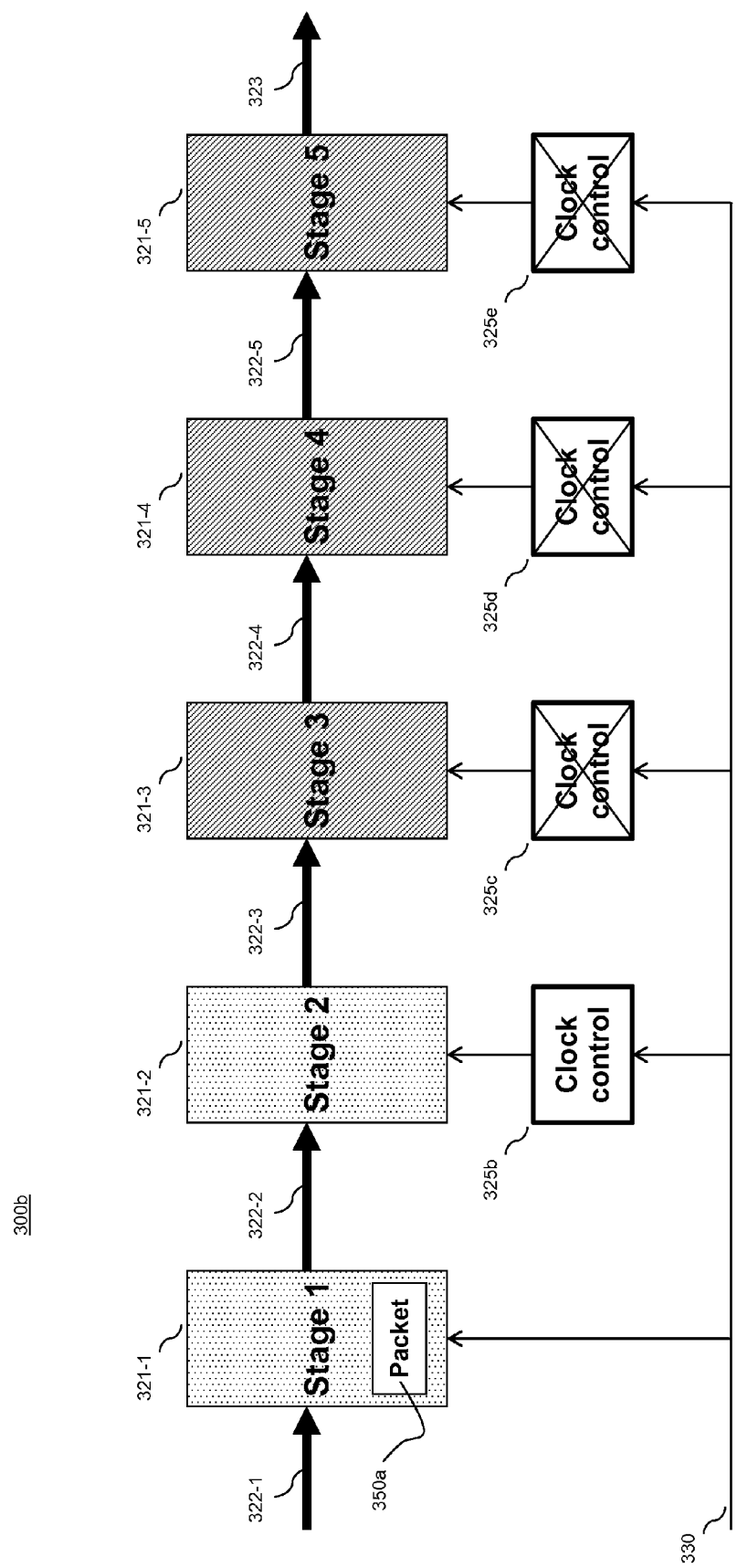

FIG. 3c shows the status of pipeline 300b when a packet 350a is present in stage 321-1. Stage 321-1 is operational to process the data packet 350a. Stage 321-2 is operational to process data from stage 321-1 as it arrives. Stages 321-3-321-5 may be idle.

Figure 3D:
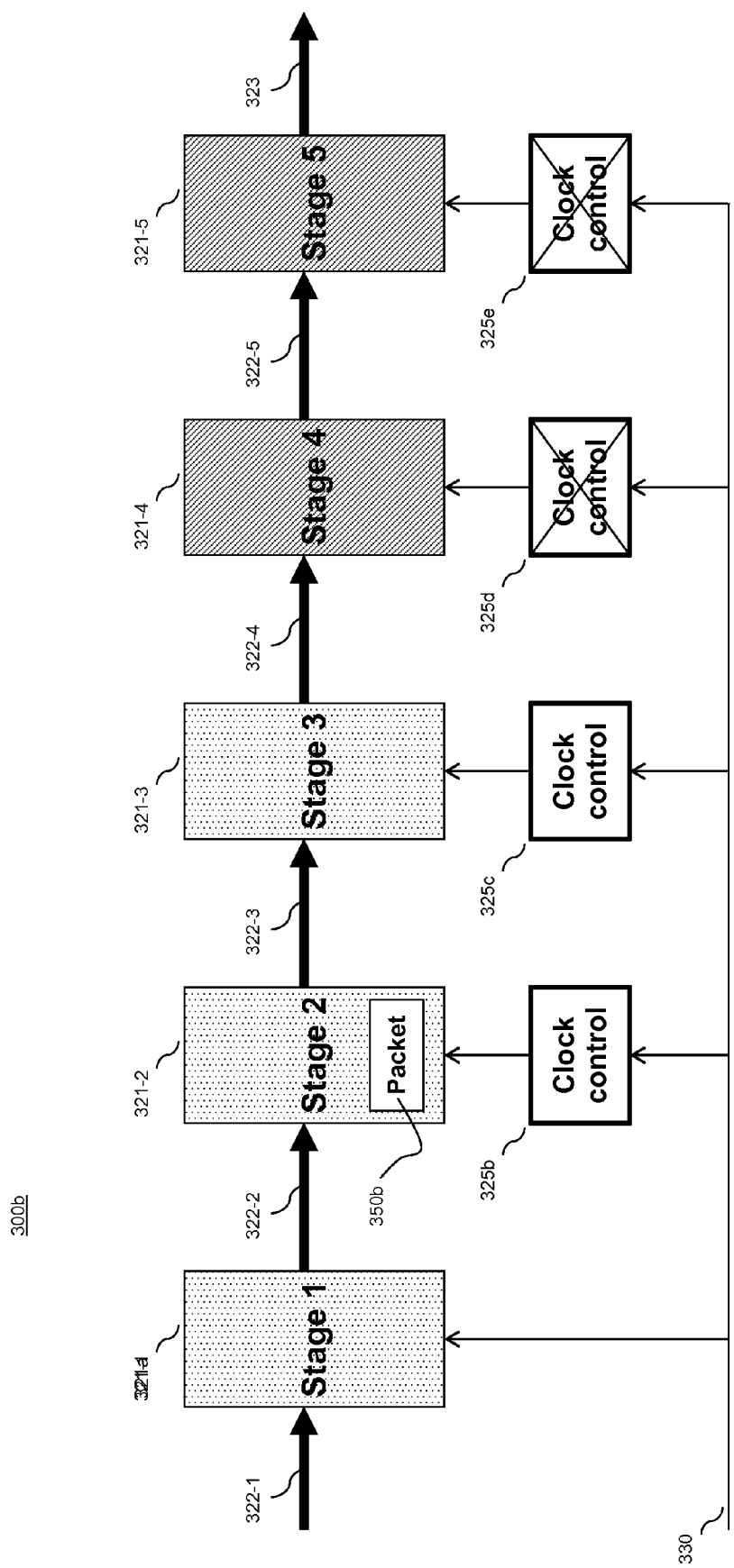

FIG. 3d shows the status of pipeline 300b when a processed packet 350b is present in stage 321-2. Stage 321-1 is operational waiting for the appearance of data. Stage 321-3 is operational to process the data packet 350b. Stage 321-3 is operational to process data from stage 321-2 as it arrives. Stages 321-4-321-5 may be idle.

Figure 3E:
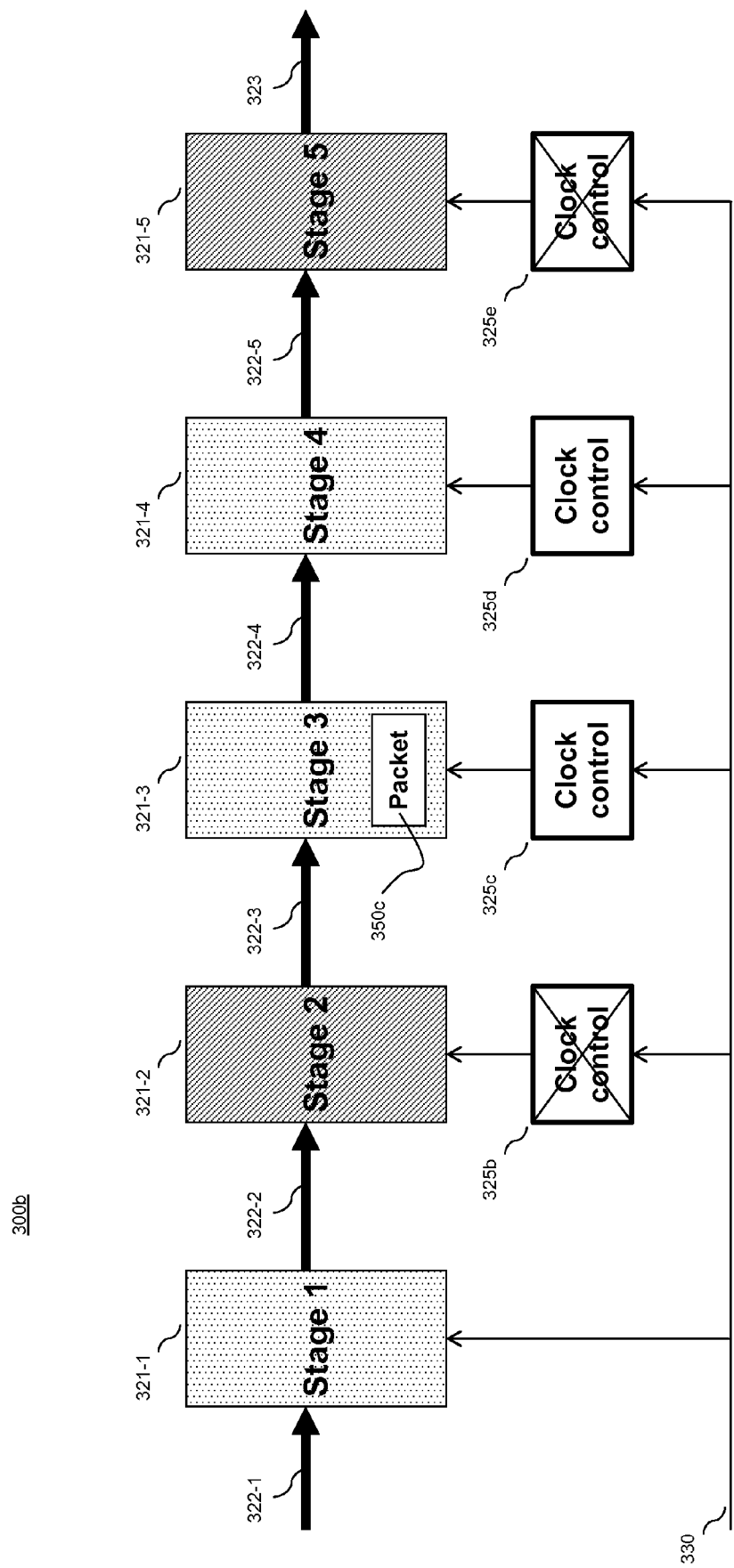

FIG. 3e shows the status of pipeline 300b when a further processed packet 350c is present in stage 321-3. Stage 321-1 is operational waiting for the appearance of data. Stage 321-2 is idle. Stage 321-3 is operational to process the data packet 350c. Stage 321-4 is operational to process data from stage 321-2 as it arrives. Stage 321-5 may be idle.

Figure 3F:
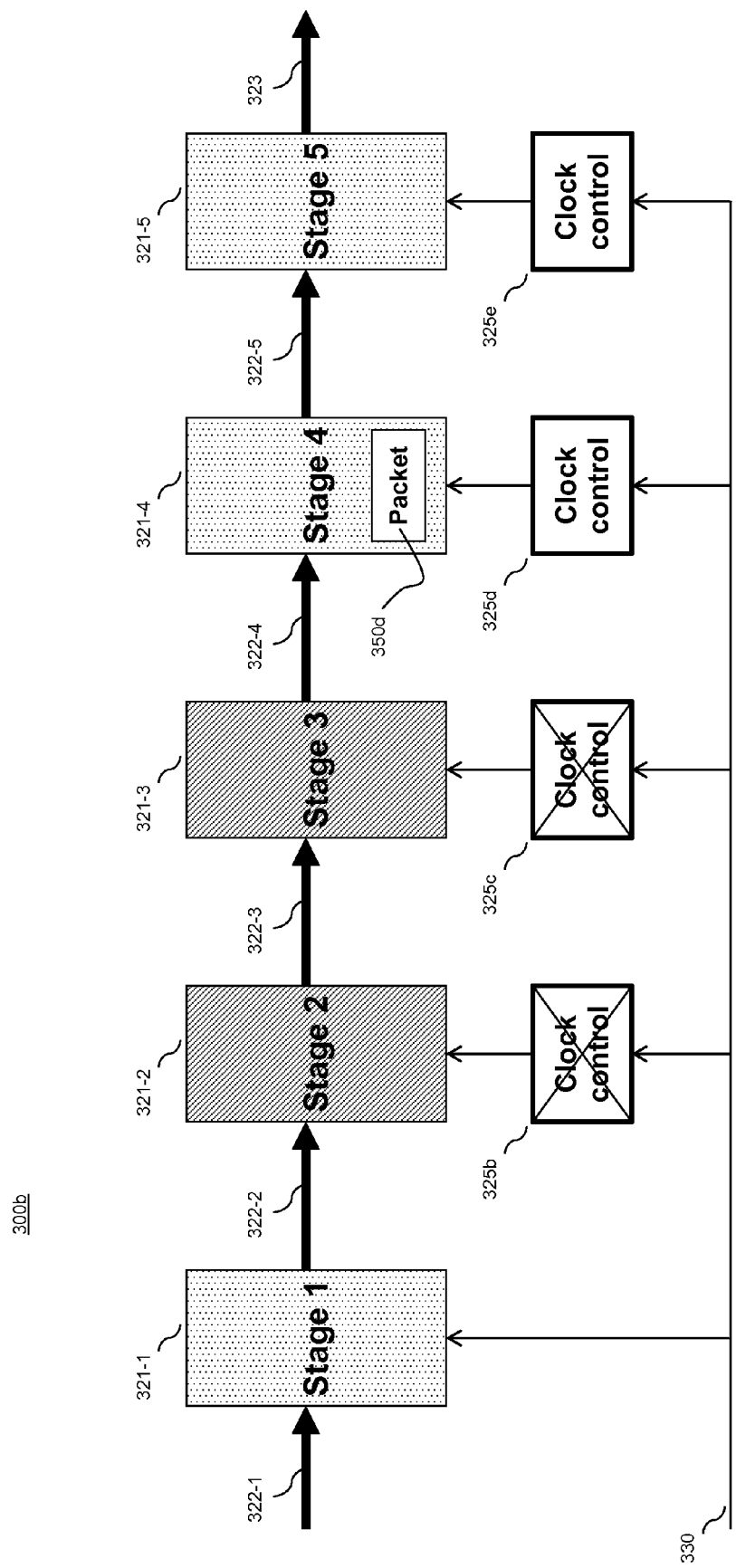

FIG. 3f shows the status of pipeline 300b when a further processed packet 350d is present in stage 321-4. Stage 321-1 is operational waiting for the appearance of data. Stage 321-2 and 321-3 may be idle. Stage 321-4 is operational to process the data packet 350d. Stage 321-5 is operational to process data from stage 321-2 as it arrives.

FIG. 3g shows the status of pipeline 300b when a further processed packet 350e is present in stage 321-5. Stage 321-1 is operational waiting for the appearance of data. Stage 321-2-321-4 may be idle. Stage 321-5 is operational to process the data packet 350e.

FIG. 3b-3g show the status of pipeline 300b as a single packet is processed. Following the rule of keeping a pipeline stage active if the previous stage has data of if the stage itself has data, may keep any, some or all of the stages active at any time. In each case the pipeline stages operate to keep data flowing at the clock rate of clock 330 while idling stages that have no data to process.

Figure 3H:
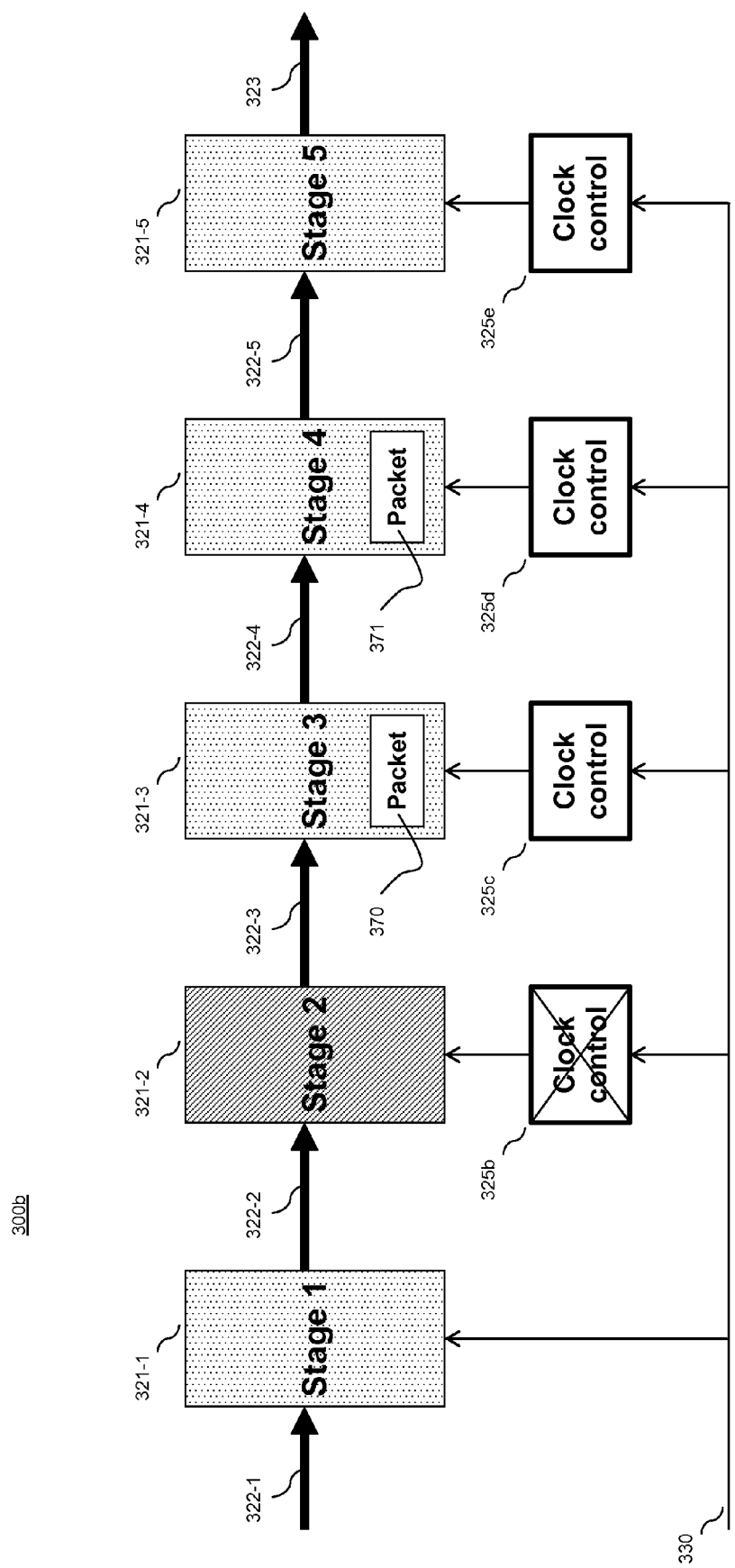

FIG. 3h shows an exemplary status of pipeline 300b when two packets are being processed. A first packet 370 is present in stage 321-3. A second packet 371 is present in stage 321-4. Stage 321-1 is operational waiting for the appearance of data. Stage 321-3 is operational to process the data packet 370. Stage 321-4 is operational to process the data packet 371 and to process data from stage 321-3 as it arrives. Stage 321-5 is operational to process data from stage 321-4 as it arrives. Stage 321-2 is idle.

The pipeline 300b may process two, three, four or five packets simultaneously. In each case some stages may be operational and others may be idle depending on the power saving strategy employed.

In an alternative embodiment stage 321-1 could also be controlled, provided data could wait—e.g., in a FIFO—for the activation of the first stage of the pipeline. Other embodiments may tolerate the loss of data may in an effort to minimize power by keeping all stages of pipeline 300b idle.

Although the data processing in the pipeline was described in terms of packet processing any type of data is contemplated is included within the scope of the invention.

If data does arrive in packets; the entire data packet may be contained in single stage until completely processed. However, it is also possible that a portion of data packet may be processed in one stage and other portions of the same packet may be further processed in different stages.

The controlling of a clock speed based on the amount of data in a FIFO, the size of the packets in FIFO and/or the idling of pipeline stages based on the availability of data by combined in any suitable manner.

One example of combined embodiments would keep the clock speed at maximum and all stages operational when the FIFO is full or nearly full. When the FIFO is partially full, a slower clock with all stages operational could be used. When FIFO is nearly empty the clock may be further slowed and some pipeline stages may be idled. Finally, all stages may be idled and data accumulated in the FIFO until a minimal threshold of data is available to process. Other suitable tradeoffs such as accumulating more data and idling more stages are contemplated and included within the scope of the invention.

Although the foregoing descriptions implies that each pipeline stage may be a single pipeline stage comprised of a register and a logic circuit other configurations are possible. A pipeline stage may be a group of registers with logic circuits between them—e.g., superpipelining. In another alternative pipeline stages may be complex circuits comprised of state machines, logic, intermediate registers etc. In yet another alternative pipeline stage may be comprised of microprocessor based system operated by software and/or firmware. Each of the foregoing alternatives is contemplated in any suitable combination and is included within the scope of the invention.

In still other embodiments of the invention, a load-based circuit, incorporating a FIFO buffer, can be used according to the invention independent of any pipelining type of circuit.

In yet other embodiments of the invention, the pipelining circuits may be used absent load-based adjustments to the clock frequency. Such embodiments preferably are independent of any latency associated with a load-based circuit.

Although each of the pipelines shown illustrates data flowing in only one direction from the output of one stage to another, other configurations are contemplated. Data may flow in both directions—e.g., from stage 321-4 to stage 321-3. Data flow may be continuous—e.g., presented at every clock cycle—or intermittent along any data path. Data flows may be serial or parallel. Each of these elements taken in any suitable combination are contemplated and included within the scope of the invention.

A method and apparatus that controls the clock of a digital circuit, and therefore power consumption, without substantially comprising performance is provided. The apparatus may include monitoring the utilization of a First in First Out (FIFO) buffer. For example in a systems and methods according to the invention, clock speed may be reduced when the FIFO is relatively empty and increased when the FIFO is relatively full. The clock speed may be controlled by a phase locked loop, a clock divider, a clock masking device or a combination of more than one of these methods. Power reduction may also be obtained by controlling the clocking of different stages of a pipelined device. Stages may be held idle when there is no data available to process for that stage. Stages may be active when there is data available to process for that stage. In the alternative, stages may be active if data is processed in a preceding stage. One or more aspects of the inventions may be implemented in combination with other aspects of the invention to further reduce power use.

Thus, methods and apparatus for that control the clock, and therefore reducing power consumption, without comprising performance have been provided. Persons skilled in the art will appreciate that the present invention can be practiced by other than the described embodiments, which are presented for purposes of illustration rather than of limitation, and that the present invention is limited only by the claims that follow.

What is claimed is:

1. A digital circuit comprising:
   at least one buffer having at least one input and at least one output and at least one status signal;
   at least one clocked device having at least one input and at least one output and at least one clock input;
   the at least one buffer connected to the at least one clocked device;
   at least one clock control module having at least one clock input and at least one output clock; and
   wherein the at least one clock control module is configured to generate the at least one output clock based on the at least one status signal, wherein the at least one output clock is connected to the at least one clock input of the at least one clocked device.

2. The digital circuit of claim 1 wherein the at least one clocked device is a circuit.

3. The digital circuit of claim 1 wherein the at least one buffer is a first in first out (FIFO) buffer.

4. The digital circuit of claim 1 wherein the status signal indicates the available space remaining in the buffer.

5. The digital circuit of claim 1 wherein the status signal indicates the size of at least one packet in the buffer.

6. The digital circuit of claim 1 wherein the status signal indicates the average size of packets in the buffer.

7. The digital circuit of claim 1 wherein the status signal indicates the average size of packets received by the buffer.

8. The digital circuit of claim 1 wherein the at least one clocked device comprises at least two pipeline stages.

9. The digital circuit of claim 8 wherein the at least one clock signal is connected to at least one of the pipeline stages.

10. The digital circuit of claim 1 wherein the at least one output of the at least one buffer is connected to the at least one input of the at least one clocked device.

11. The digital circuit of claim 1 wherein the at least one input of the at least one buffer is connected to the at least one output of the at least one clocked device.

12. The digital circuit of claim 1 wherein the clock control module comprises at least one phase locked loop.

13. The digital circuit of claim 1 wherein the clock control module comprises at least one clock divider.

14. The digital circuit of claim 1 wherein the clock control module masks the at least one input clock to generate the at least one output clock.

15. A method of saving power in a digital circuit, the circuit comprising at least one buffer having at least one input and at least one output and at least one status signal, the buffer coupled to at least one clocked circuit, wherein the at least one clocked circuit has at least one input and at least one output and at least one clock input, the method comprising:
   providing the at least one input clock;
   generating at least one output clock based on the at least one input clock and the at least one status signal; and
   clocking the at least one clocked circuit with the at least one output clock.

16. The method of claim 15 wherein the status signal indicates the available space remaining in the buffer.

17. The method of claim 15 wherein the status signal indicates the size of at least one packet in the buffer.

18. The method of claim 15 wherein the status signal indicates the average size of packets in the buffer.

19. The method of claim 15 wherein the status signal indicates the average size of packets received by the buffer.

20. The method of claim 15 wherein the at least one buffer is a first in first out buffer.

21. The method of claim 15 wherein the at least one input of the at least one buffer is connected to the at least one output of the at least one clocked device.

22. The method of claim 15 wherein the output clock is generated by at least one phase locked loop.

23. The method of claim 15 wherein the clock control module is at least one clock divider.

24. The method of claim 15 wherein the output clock is generated by masking the at least one input clock.

25. A pipelined digital circuit comprising:
a buffer having at least one status signal;
a first stage, the buffer coupled to the first stage;
a second stage; and
at least one clock control coupled to the buffer, the first stage and the second stage;
wherein the at least one clock control controls the operation of the first stage based, at least in part, on the status signal and controls the second stage based on the amount of data in the first stage.

26. The pipelined digital circuit of claim 25 wherein the at least one clock control permits the operation of the at least one of the first stage and the second stage, based, at least in part, on the amount of data in one of the first stage and the second stage.

27. The pipelined digital circuit of claim 25, wherein the output of the first stage is connected to the input of the second stage,
wherein the at least one clock control permits the operation of the second stage based, at least in part, on the amount of data in the first stage.

28. The pipelined digital circuit of claim 25 wherein the status signal indicates the available space remaining in the buffer.

29. The pipelined digital circuit of claim 25 wherein the status signal indicates the size of at least one packet in the buffer.

30. The pipelined digital circuit of claim 25 wherein the status signal indicates the average size of packets in the buffer.

31. The pipelined digital circuit of claim 25 wherein the status signal indicates the average size of packets received by the buffer.

32. The pipelined digital circuit of claim 25, wherein the at least one of the first stage and the second stage comprises a clock input, wherein the at least one clock control provides the clock for the at least one of the first stage and the second stage.

33. A method of saving power in a pipelined digital circuit of the circuit comprising a buffer having at least one status signal, a first stage, the buffer coupled to the first stage, a second stage and at least one clock control coupled to the buffer, the first stage and the second stage, the method comprising:
measuring the amount of data in the pipelined digital circuit; and
permitting the operation of the at least one of the first stage and the second stage based, at least in part, the amount of data in the pipelined digital circuit.

34. The method of saving power in the pipelined digital circuit of claim 33, wherein the data measured is data contained in the at least one of the first stage and the second stage.

35. The method of saving power in the pipelined apparatus of claim 33, wherein the data measured is data contained in the first stage.

36. The method of saving power in the pipelined apparatus of claim 33, wherein the data measured is data contained in the buffer.

* * * * *